United States Patent [19]

Patel et al.

[11] Patent Number: 4,896,104

[45] Date of Patent: Jan. 23, 1990

[54] DIGITAL PEAK AND VALLEY DETECTOR

[75] Inventors: Chandravadan N. Patel, Los Altos; Richard Wm. Blasco, Auburn, both of Calif.; Atsushi Kiuchi; Hiromitsu Inada, both of Tokyo, Japan

[73] Assignee: Hitachi Micro Systems, Inc., San Jose, Calif.

[21] Appl. No.: 311,161

[22] Filed: Feb. 15, 1989

[51] Int. Cl.$^4$ .................. G01R 19/16; H03K 5/153
[52] U.S. Cl. ........................... 324/103 P; 307/351; 324/102
[58] Field of Search ................. 324/103 P, 102, 111; 307/351, 353; 364/483

[56] References Cited

U.S. PATENT DOCUMENTS 4,644,270 2/1987 Oates et al. ............... 324/103 P
4,746,816 5/1988 Olesen ............................ 307/351

*Primary Examiner*—Ernest F. Karlsen
*Attorney, Agent, or Firm*—Koda and Androlia

[57] ABSTRACT

A digital peak and valley detector including a peak value address register, a valley value address register, a peak value data register, a valley value data register, a peak comparator for comparing the value stored in the peak value data register with value data contained in the digital signal applied to the digital peak and valley detector and for causing the greater of the two to be stored in the peak value data register while simultaneously storing the address in the peak value address register and a valley comparator for comparing the valley value contained in the valley value data register with the value data contained in the digital signal applied to the digital peak and valley detector for determining which is less and for causing the value and the address of the smaller of the two to be stored respectively in the valley value data and the valley value address registers.

4 Claims, 1 Drawing Sheet

DIGITAL PEAK AND VALLEY DETECTOR

BACKGROUND OF THE INVENTION

1. Field of the Invention

This invention relates to an electronic circuit for detecting the peak and valley values together with the respective addresses of the peak and valley values in a digital signal and particularly to such electronic circuits which can be implemented as integrated circuits.

2. Prior Art

In digital signal processing it is sometimes desirable to determine the peak value, the valley value or a combination of both. To this end, various electronic circuits have been devised, but such electronic circuits have certain disadvantages.

In particular, most electronic circuits which have been devised are capable of either only detecting the peak value or only detecting the valley value. An example of such a circuit is contained in U.S. Pat. No. 4,311,960. However, such simple circuits are not capable of storing the address of the peak or valley value which they have detected and in some applications the address may be a useful or essential piece of information which would be required along with the peak or valley value. As a result, complicated additional circuitry must be added to determine the address.

In addition to the less complicated circuits described above which are only capable of determining either the peak value or the valley value, but not both, there exists circuitry capable of determining both the peak and valley values; an example of which is contained in U.S. Pat. No. 4,006,413. However, circuits such as those disclosed in this patent also have certain disadvantages in that they involve complicated circuitry which is implemented with a great number of discrete or integrated circuits and is therefore not capable of being implemented as an integrated circuit. In addition, circuits such as those disclosed in U.S. Pat. No. 4,006,413, while being able to determine the peak and valley values, are not capable of determining the addresses of the peak and valley values and again additional complicated circuitry would have to be added to determine the address.

In addition to the circuits described above, there does exist a circuit for determining the peak value and the time at which the peak value occurred. Such a circuit is described in U.S. Pat. No. 4,654,588. However, such a circuit has many of the disadvantages of the other circuits in that it is implemented with discrete circuit elements and separate integrated circuits, requires custom integrated circuits and cannot be completely integrated with simple and inexpensive to design circuits. Furthermore, the circuit shown therein is only a peak detector, does not include a valley value detector and is intended for use in high voltage (relative to the usual integrated circuit voltages) applications.

SUMMARY OF THE INVENTION

Accordingly, it is a general object of the present invention to provide an electronic circuit which not only determines the peak and valley values, but also the peak and valley value addresses.

It is yet another object of the present invention to provide an electronic circuit which is simple and easily implemented utilizes integrated circuit techniques and particularly large scale integrated circuit techniques.

In keeping with the principles of the present invention, the objects are accomplished by a unique digital peak and valley detector for receiving digital data which includes both address data and value data. The digital peak and valley detector includes a peak value address register which continuously receives the address data and which stores an address of a detected peak value, a valley value address register which also receives the address data and which stores the address of the detected valley value, a peak value data register which receives the value data and stores a peak value of the value data therein, a valley value data register which receives the value data and stores a valley value of the value data therein, a peak comparator which compares the value data with the value in the peak value data register and which generates an enable signal when the value of successive value data exceeds the value contained in the peak value data register, an enabling circuit for latching the address and value data into the peak value address register and the peak value data register when the enable signal is generated by the peak comparator, a valley comparator which compares the value data with the value in the valley value data register and which generates another enable signal when the value of a successive value data is less than that stored in the peak value data register, and another enabling means for latching the address and value data into the value valley address register and valley value data register when the another enabling signal is generated by the valley comparator.

BRIEF DESCRIPTION OF THE DRAWINGS

The above mentioned features and objects of the present invention will become more apparent with reference to the following description taken in conjunction with the accompanying drawings in which like reference numerals denote like elements and in which.

DETAILED DESCRIPTION OF THE INVENTION

Figure 1:
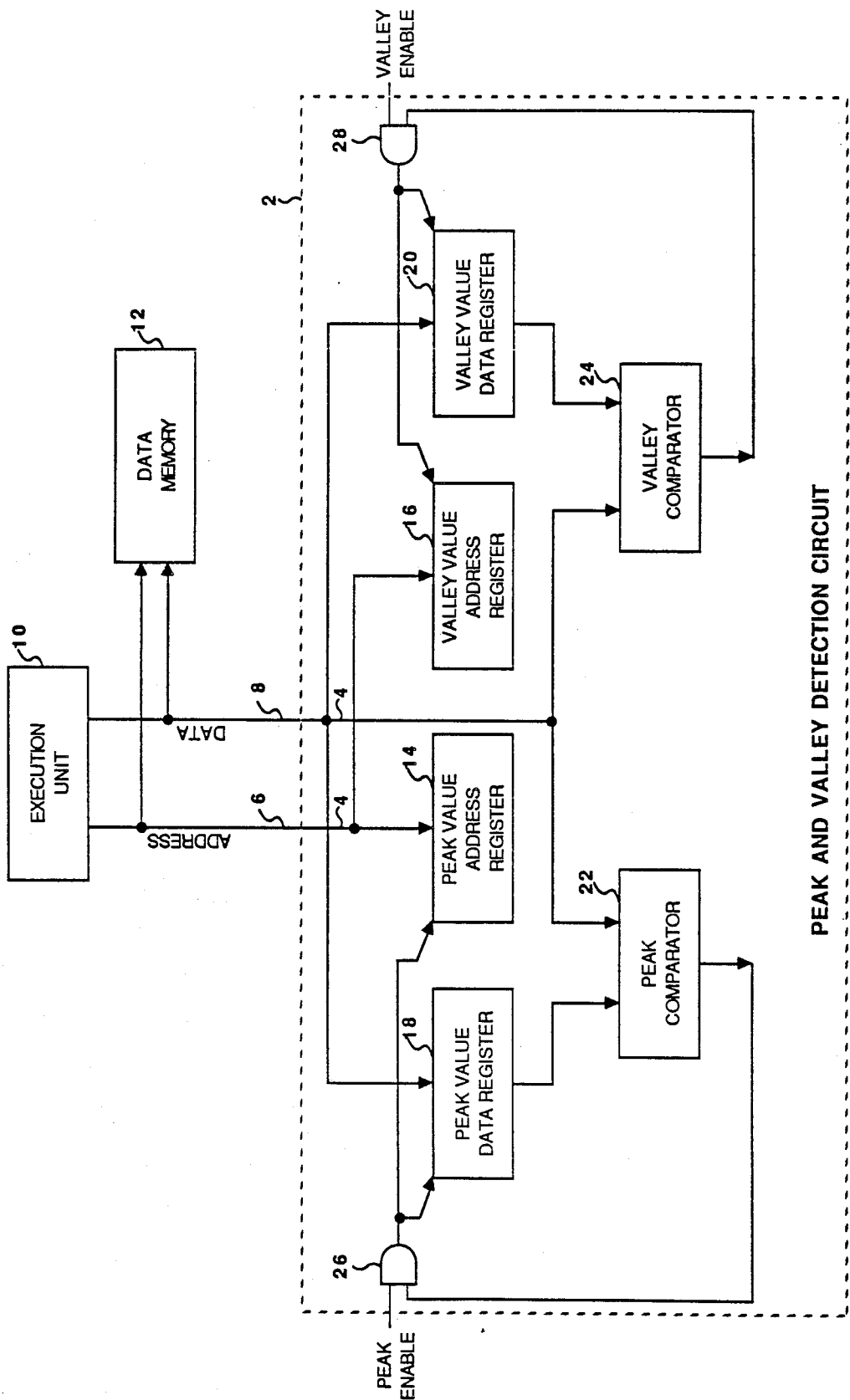
FIG. 1 is a block diagram illustrating the construction of a peak and valley data detector in accordance with the teachings of the present invention.

Referring particularly to FIG. 1, shown therein is a digital peak and valley detector in accordance with the teachings of the present invention. In FIG. 1, the digital peak and valley detector 2 includes inputs 4 to which is applied a digital signal which includes address data 6 and value data 8. The digital signal is generated by an execution unit 10 and the execution unit 10 can be any digital electronic device such as a computer, digital data sensors, analog to digital convertors which convert analog signals into digital data, etc. Furthermore, the address data 6 and value data 8 may also be stored in a data memory 12.

The address data 6 which is applied to the input 4 of the digital peak and valley detector 2 is applied to the inputs of the peak value address and valley value address registers 14 and 16, respectively. The value data 8 which is applied to the input 4 of the digital peak and valley detector 2 is supplied to the inputs of peak value data and valley value data registers 18 and 20, respectively, and also to the inputs of peak and valley comparators 22 and 24, respectively.

Also, the output of the peak value data register 18 which represents the value stored in the peak value data register is supplied to another input of the peak comparator 22 and similarly the output of the valley value data register 20 which represents the value stored in the valley value data register 20 is supplied to another input of the valley comparator 24. The output of the peak comparator 22 which is either a logical 0 or a logical 1 is applied to one input of an AND gate 26 and to other input of the AND gate 26 is applied a peak enable signal which is externally generated and which also is a logical 0 or logical 1. Similarly, the output of the valley comparator 24 which is also a logical 0 or a logical 1 is applied to an input of AND gate 28 and a valley enable signal is similarly applied to the other input of the AND gate 28.

The output of AND gate 26 which is a logical 0 or a logical 1 is supplied to the latching or load inputs of the peak value data register 18 and the peak value address register 14. The output of the AND gate 28 which is a logical 0 or a logical 1 is supplied to the latching or load inputs of the valley value data register 20 and the valley value address register 16.

In the above described circuitry it should be apparent to one skilled in the art that the peak value address and valley value address registers are N bit registers and the value of N is an integer which is equal to or greater than the number of bits contained in a single word of address data. Similarly, the peak value data and valley value data registers 18 and 20 are M bit registers and the value of M is an integer equal to or greater than the number of bits contained in a word of value data 8. Furthermore, it should be apparent that N does not have to equal M.

In operation the digital peak and valley detector is put into the ready state by applying valley enable and peak enable signals to the AND gates 26 and 28 which are a logical 1 and the registers 18 and 20 are reset respectively to minimum and maximum values. Address data 6 and value data 8 are then supplied to the inputs 4 of the digital peak valley detector 2 by the execution unit 10. Since the registers 18 and 20 are respectively reset to minimum and maximum values, the first value of the value data 8 will be compared with the minimum value contained in the peak value data register 18 by the peak comparator 22. If the first value of the value data 8 is greater than the minimum value, the peak comparator 22 will generate an able signal which is a logical 1 which will be applied to one of the inputs of the AND gate 26 causing a logical 1 to be generated at the AND gate 26 and finally latching or loading the first value of the value data 8 into the peak value data register 18 and the first address of the address data 6 into the peak value address register 14. If, however, the first value of the value data 8 is less than or equal to the minimum value, the peak comparator will not generate an enable signal and the first value and first address of the value data 8 and address data 6 will not be loaded o latched into the peak value data register 18 and the peak value address register 14. Similarly, the peak comparator 22 will continuously compare the output of the peak value data register to the consecutive value data 8 from the execution unit 10 and will emit an enable signal whenever the value of the consecutive data is higher than that stored in the peak value data register 18 and this enabling signal will cause that value and the address of that value to be latched or loaded into the peak value data register 18 and the peak value address register 14.

Looking again at the first value of the value data 8, just as it is applied to the peak value data register and the peak detector 22, it is also applied to the valley value data register 20 and the valley comparator 24. In the valley comparator 24, the maximum value which is contained in the valley value data register 20 is compared with the first value of the value data 8 and if the first value of the value data 8 is less than maximum value, the valley comparator 24 will generate an output which is a logical 1 which will be applied to the AND gate 28 together with the logical 1 of the valley enable signal. The output of the AND gate 28 which will then be a logical 1 will be applied to the load or latching inputs of the valley value address register 16 and the valley value data register 20 and the first value of the value data 8 and the first address of the address 6 will be respectively latched into the valley value data register 20 and the valley value address register 16.

In a similar manner, if the first value of the value date 8 is greater than or equal to the maximum value, an enable signal will not be generated and a logical 0 will appear at one of the inputs of the AND gate 28 resulting in a logical 0 at the output of the AND gate 28. Accordingly, the first value and first address of the value data 8 and address data 6 will not be loaded or latched into the valley value data register 20 and the valley value address register 16.

In a similar manner, the valley comparator 24 continuously compares the output of the valley value data register 20 with the successive value data 8 and emits an enable signal which is a logical 1 whenever the value of the successive values of the value data 8 have a lower value than that stored in the valley value data register 20. This enabling signal from the valley comparator 24 is applied together with the valley enable signal to the AND gate 28 to cause this value and the address of this value to be loaded into the valley value data register 20 and the valley value address register 16, respectively.

It should be apparent to those skilled in the art that the above described circuitry for a digital peak and valley detector can be simply and inexpensively implemented utilizing integrated circuit techniques and particularly large scale integrated circuit techniques in a single chip utilized for high speed digital signal processing; specifically, in the processing of digital data in Fast Fourier Transform calculations wherein signal amplitude may be represented by data value while signal frequency may be represented by address data. In addition, being able to not only detect both the peak and valley values but also the addresses of the peak and valley values substantially increases the speed and efficiency of processing digital data.

It should also be readily apparent to those skilled in the art that the above-described embodiment is merely illustrative of but one embodiment of the present invention and numerous and various other embodiments can be devised which are within the scope of the present invention without departing from the spirit and scope thereof.

We claim:

1. A digital peak and valley detector for receiving digital data which includes both address data and value data, said detector comprising:

a peak value address register to which is applied said address data for storing an address of a detected peak value;

a valley value address register to which is applied said address data for storing an address of a detected valley value;

a peak value data register to which is applied said value data for storing a peak value;

a valley value data register to which is applied said valley data for storing a valley value;

a peak comparator to which is applied the value data and a value of a peak value stored in said peak value data register for comparing said peak value stored in said peak value data register with successive value data and for generating a first enable signal when a value in said successive value data exceeds a value of said peak value stored in said peak value data register;

a first means for latching address and value data into said peak value address register and said peak value data register respectively in response to said first enable signal;

a value comparator to which is applied said value data and a value of a valley value stored in said valley value data register for comparing said valley value stored in said valley value data register with successive value data and for generating a second enable signal when a value in said successive valley data is less than a value of said valley value stored in said valley value data register; and a second means for latching address and value data into said valley value address register and said valley value data register respectively in response to said second enable signal.

2. A digital peak and valley detector according to claim 1, wherein the valley value and peak value address registers are each N bit registers and the peak value and valley value data registers are each M bit registers wherein N and M are positive integers.

3. A digital peak and valley detector according to claim 1 wherein said detector is an integrated circuit.

4. A digital peak and valley detector according to claim 1 wherein said first and second means for latching comprise an AND gate.

* * * * *